(12) United States Patent
Zhang (10) Patent No.: US 11,942,487 B2
(45) Date of Patent: Mar. 26, 2024

(54) ARRAY SUBSTRATE AND DISPLAY PANEL (71) Applicant: TCL CHINA STAR OPTOELECTRONICS TECHNOLOGY CO., LTD., Shenzhen (CN)

(72) Inventor: Xin Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 527 days.

(21) Appl. No.: 17/281,909

(22) PCT Filed: Mar. 23, 2021

(86) PCT No.: PCT/CN2021/082313
§ 371 (c)(1),
(2) Date: Mar. 31, 2021

(87) PCT Pub. No.: WO2022/193337
PCT Pub. Date: Sep. 22, 2022

(65) Prior Publication Data
US 2023/0107895 A1    Apr. 6, 2023

(30) Foreign Application Priority Data

Mar. 16, 2021 (CN) .......................... 202110279598.2

(51) Int. Cl.
*H01L 27/12* (2006.01)
(52) U.S. Cl.
CPC .................. *H01L 27/124* (2013.01)

(58) Field of Classification Search
CPC ..................................................... H01L 27/124
See application file for complete search history.

(56) References Cited

U.S. PATENT DOCUMENTS

| 2019/0146292 A1* | 5/2019 | Woo ..................... G09G 3/3696 349/139 |
| 2020/0411557 A1 | 12/2020 | Xi |
| 2021/0286224 A1* | 9/2021 | Chen ................. G02F 1/134345 |

(Continued)

FOREIGN PATENT DOCUMENTS

| CN | 101609643 A | 12/2009 |
| CN | 105470269 A | 4/2016 |

(Continued)

*Primary Examiner* — Douglas M Menz
(74) *Attorney, Agent, or Firm* — PV IP PC; Wei Te Chung; Zhigang Ma (57) ABSTRACT

The prevent application provides an array substrate and a display panel. The array substrate is provided with a plurality of rows of pixel units, wherein each of the pixel units is provided with a transistor area; a main transistor unit, a sub-transistor unit, and a shared transistor unit are disposed in the transistor area; and the shared transistor unit includes a source and a drain; each of the plurality of rows of the pixel units is provided with a shared metal wiring; and the shared metal wiring is provided above the transistor area and extends along an arrangement direction of the pixel units in a corresponding one of the plurality of rows, and is electrically connected to a source of the shared transistor unit in each of the pixel units, sequentially.

20 Claims, 5 Drawing Sheets

(56) References Cited

U.S. PATENT DOCUMENTS

2021/0333655 A1* 10/2021 Cao ................... G02F 1/134309
2022/0308403 A1* 9/2022 Cao ................... G02F 1/134309

FOREIGN PATENT DOCUMENTS

| CN | 105974701 A | 9/2016 |
| CN | 106842750 A | 6/2017 |
| CN | 110109296 A | 8/2019 |
| CN | 111025802 A | 4/2020 |
| CN | 111258142 A | 6/2020 |
| CN | 111474780 A | 7/2020 |

* cited by examiner

ARRAY SUBSTRATE AND DISPLAY PANEL

RELATED APPLICATIONS

This application is a Notional Phase of PCT Patent Application No. PCT/CN2021/082313 having international filing date of Mar. 23, 2021, which claims the benefit of priority of Chinese Patent Application No. 202110279598.2 filed on Mar. 16, 2021. The contents of the above applications are all incorporated by reference as if fully set forth herein in their entirety.

BACKGROUND OF INVENTION

Field of Invention

The present application relates to the field of display technology, in particular to an array substrate and a display panel.

Description of Prior Art

Multi-domain alignment liquid crystal displays (MVA LCDs) have been widely used in large-sized liquid crystal displays and TVs with the advantages of high contrast and wide viewing angles. With the evolution of toward a larger screen size, 8-domain pixel design has attracted attention in large-sized displays due to its excellent performance of viewing angles.

Figure 1:
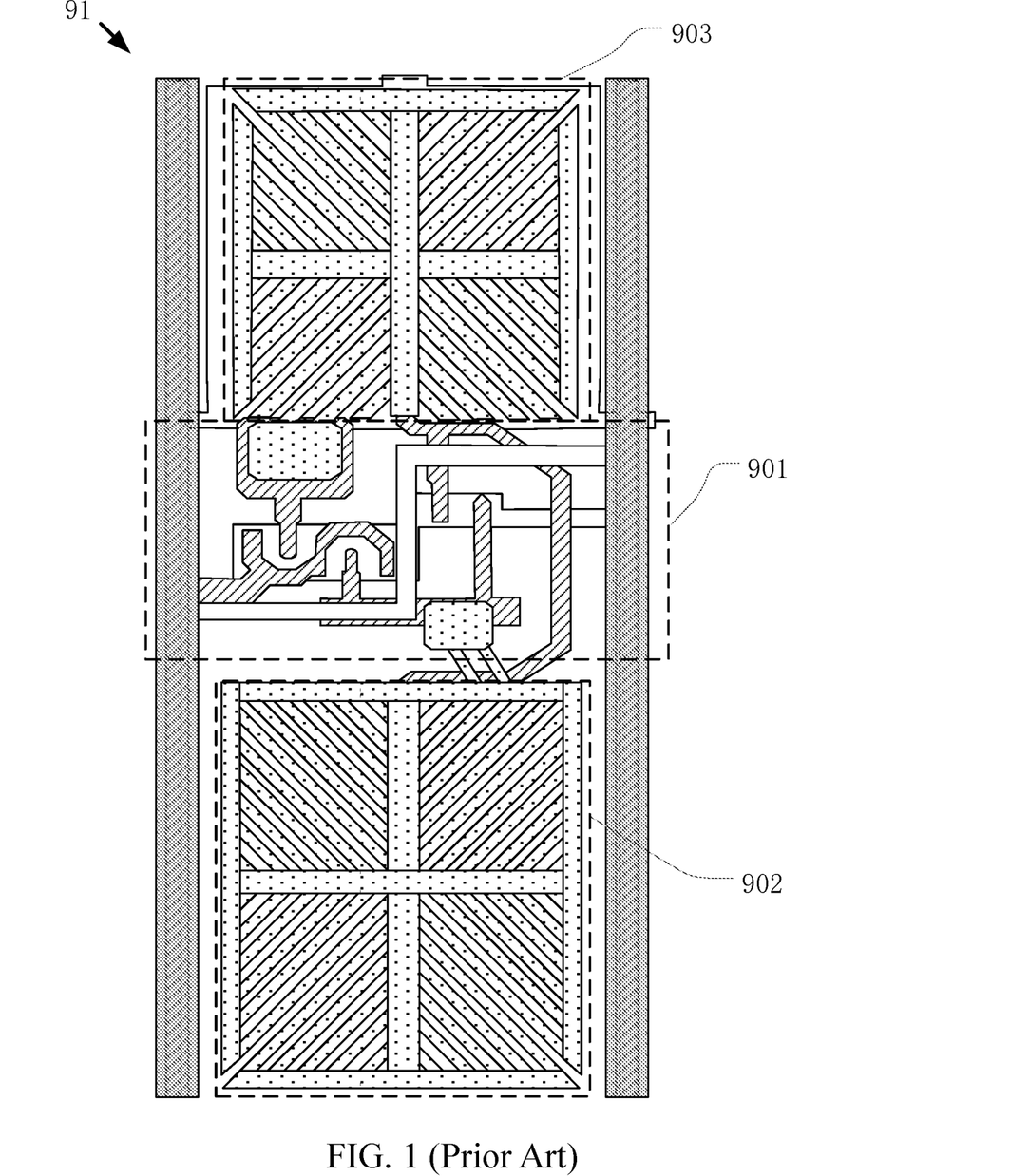
FIG. 1 is a schematic diagram of a planar structure of an existing array substrate with an 8-domain pixel structure.

As shown in FIG. 1, it is a schematic diagram of a planar structure of an existing array substrate with an 8-domain pixel structure. The array substrate 91 includes a transistor area 901, and a main pixel area 902 and a sub-pixel area 903 located on the upper and lower sides of the transistor area 901, respectively; wherein the transistor area 901 mainly adopts a 3T structure.

Figure 2:
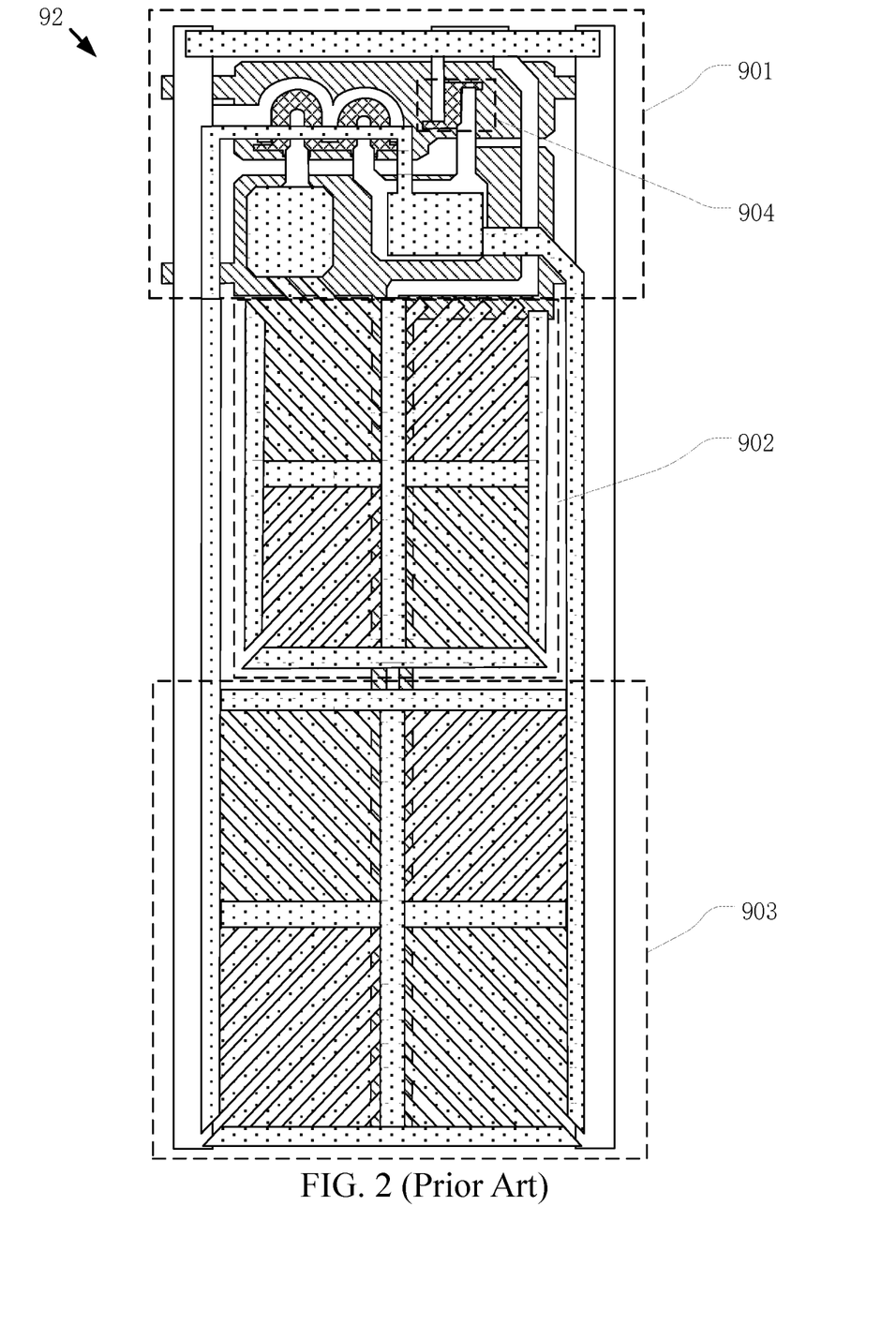
FIG. 2 is a schematic diagram of the planar structure of another conventional array substrate with an 8-domain pixel structure.

As shown in FIG. 2, it is a schematic diagram of the planar structure of another existing array substrate with an 8-domain pixel structure. The array substrate 92 is designed by using a sub-data shield (SDS) structure, which is based on the structure shown in FIG. 1, but removing the common electrode (ACOM) on the side of the data line (Data), and using the sub-pixel electrode (Sub PE) to overlap the data line to shield the electric field of the data line. The sub-pixel electrode of the sub-pixel area 903 forms a structure to half-enclose the sub-pixel electrode of the main pixel area 902, to reduce the coupling capacitance between the sub-pixel electrode of the main pixel area 902 and the data line, thereby achieving the object of increasing the aperture ratio (also called light transmittance) by nearly 10% without impacting the viewing angle taste. The SDS structure can greatly increase the light transmittance of the LCD panel by nearly 10%, thereby improving the image quality and enhancing the competitiveness of the product.

However, the drains of the shared transistors 904 of the 3T structure in the pixel structure shown in FIG. 2 are all arranged in tandem and made of opaque metal materials, and the drains penetrate the main pixel area 902 and the sub-pixel area 903, resulting in a low aperture ratio of the main pixel area 902 and the sub-pixel area 903.

Therefore, there is an urgent need to propose a new array substrate and display panel to achieve the object of high aperture ratio.

SUMMARY OF INVENTION

An object of the present application is to provide an array substrate and a display panel to solve the technical problem of a low aperture ratio of the main pixel area and the sub-pixel area in the existing 8-domain pixel structure caused by arranging all the drains of the shared transistors of the 3T structure in tandem which are made of opaque metal materials and penetrates the main pixel area and the sub-pixel area.

In order to achieve the above object, the present application provides an array substrate, including a plurality of rows of pixel units, wherein each of the pixel units is provided with a transistor area; a main transistor unit, a sub-transistor unit, and a shared transistor unit are disposed in the transistor area; and the shared transistor unit includes a source and a drain; each of the plurality of rows of the pixel units is provided with a shared metal wiring; and the shared metal wiring is provided above the transistor area and extends along an arrangement direction of the pixel units in a corresponding one of the plurality of rows, and is electrically connected to the source of the shared transistor unit in each of the pixel units, sequentially.

Further, the shared transistor unit includes: a glass substrate;

a first metal layer disposed on the glass substrate; a gate insulating layer disposed on the glass substrate and covering the first metal layer; a second metal layer disposed on the gate insulating layer; and a passivation layer disposed on the gate insulating layer and covering the second metal layer, and provided with a via hole to expose an upper surface of the second metal layer, wherein the shared metal wiring is disposed on the passivation layer and penetrates through the via hole to electrically connect the second metal layer.

Further, a material of the shared metal wiring includes indium tin oxide.

Further, the shared metal wiring is provided with a widened portion at a position corresponding to the via hole.

Further, the widened portion protrudes from an edge of the shared metal wiring toward a side of the transistor area.

Further, each of the pixel units includes a red sub-pixel, a green sub-pixel, and a blue sub-pixel.

Further, the shared metal wiring is electrically connected to the blue sub-pixel.

Further, a scan line is provided in the transistor area, and the shared metal wiring is arranged in parallel with the scan line.

Further, each of the pixel units further includes: a pixel area defined at one side of the transistor area, wherein an arrangement direction of the pixel area and the transistor area is perpendicular to an extending direction of the shared metal wiring.

Further, the pixel area includes: a main pixel area arranged adjacent to the transistor area and electrically connected to a source of the main transistor unit; and a sub-pixel area arranged at a side of the main pixel area away from the transistor area and electrically connected to drains of the sub-transistor unit and the shared transistor unit.

Further, the sub-pixel area is U-shaped to half-enclose around the main pixel area.

Further, an area of the main pixel area is smaller than an area of the sub-pixel area.

Further, a top-view projection of the main pixel area is an axisymmetric pattern.

Further, a top-view projection of the sub-pixel area is an axisymmetric pattern.

The present application also provides a display panel, including the array substrate described in any one of the preceding paragraphs.

In order to achieve the above object, the present application also provides a display panel including the array substrate described above.

The technical effect of the present application is to provide an array substrate and a display panel. On the one hand, a shared metal wiring made of indium tin oxide is electrically connected to the source of the shared transistor unit of each of the pixel units, such that the source of the shared transistor unit does not need to penetrate through the pixel area, thereby increasing the aperture ratio of the pixel area and increasing the transmittance of the display panel; and the shared metal wiring connects the shared transistor units, which can uniformly control the leakage of the shared transistor units. On the other hand, by arranging the main pixel area and the sub-pixel area on the same side of the transistor area, the area occupied by the transistor area is reduced; and meanwhile, the sub-pixel area forms a structure to half-enclose around the main pixel area, which can increase the distance between the main pixel area and the main data area to reduces the coupling capacitance therebetween and improve the color shift. On further the other hand, the common electrode wiring between adjacent ones of the sub-pixel areas, and the source and the drain wirings surrounding the main pixel area and the sub-pixel area are removed, which can shorten the distance between the borders of the second pixel electrodes of adjacent ones of the sub-pixel areas, thereby increasing the distribution width of the pixel electrodes in the main pixel area and the sub-pixel area, thus increasing the aperture ratio.

Elements in the drawings are designated by reference numerals listed below.

1. shared metal wiring, 2. scan line, 3. data wiring,
10. transistor area, 11. main transistor unit, 12. sub-transistor unit,
13. shared transistor unit, 20. pixel area, 21. main pixel area,
211. first pixel electrode, 22. sub-pixel area, 221, second pixel electrode,
31. glass substrate, 32. first metal layer, 33. gate insulating layer,
34. second metal layer, 35. passivation layer, 36. via hole,
100. array substrate, 101. widened portion 110. pixel unit.

DETAILED DESCRIPTION OF PREFERRED EMBODIMENTS

The preferred embodiments of the present invention are described below with reference to the accompanying drawings, which are used to exemplify the embodiments of the present invention, which can fully describe the technical contents of the present invention to make the technical content of the present invention clearer and easy to understand. However, the present invention may be embodied in many different forms of embodiments, and the scope of the present invention is not particularly limited to the embodiments set forth herein.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the drawings, the thickness of layers and areas are exaggerated for clarity. For example, for ease of description, the thicknesses and sizes of the elements in the drawings are arbitrarily shown, and therefore, the described technical scope is not particularly limited by the drawings.

Figure 3:
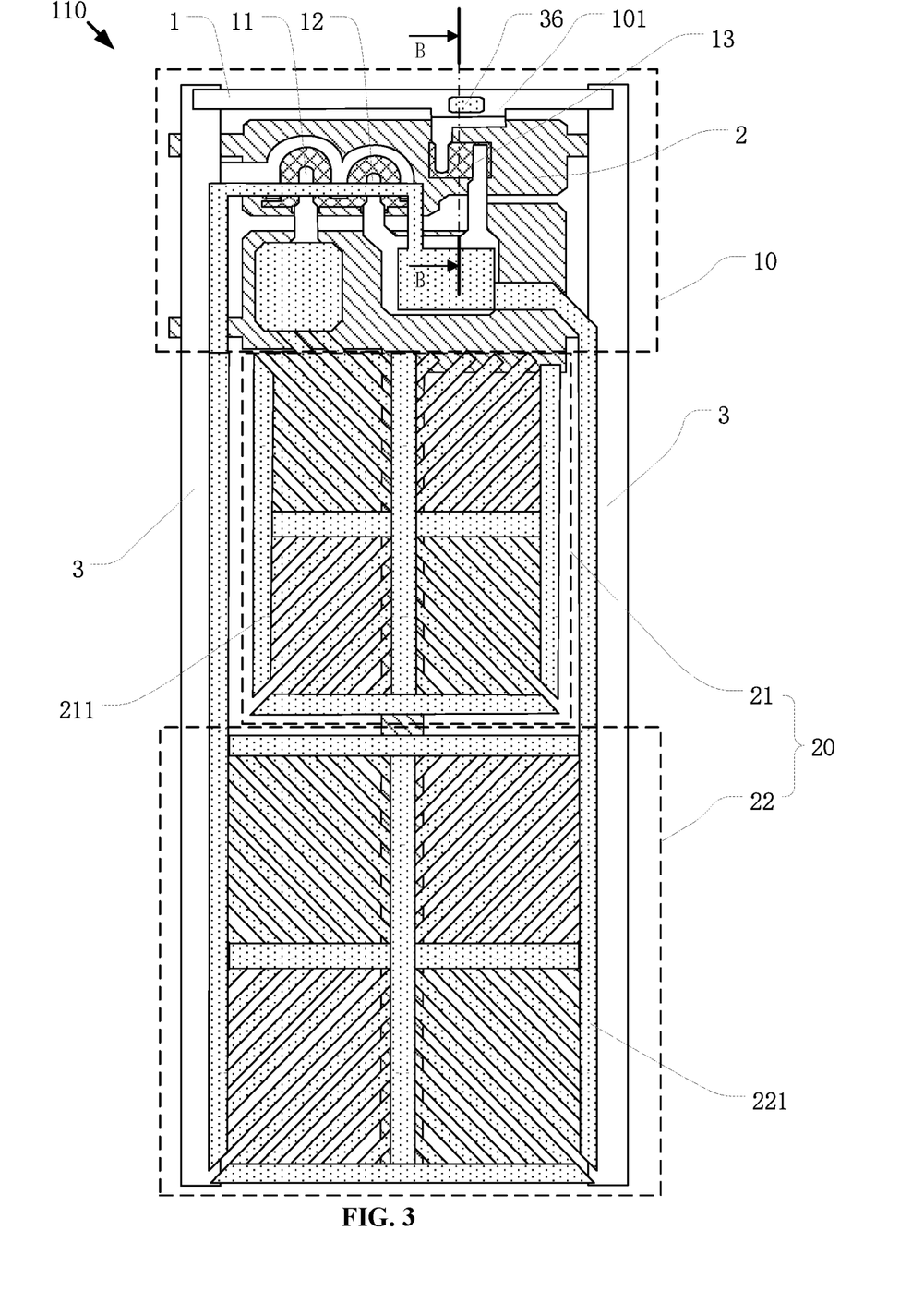
FIG. 3 is a schematic diagram of a planar structure of a pixel unit of the array substrate in an embodiment of the present application.
Figure 4:
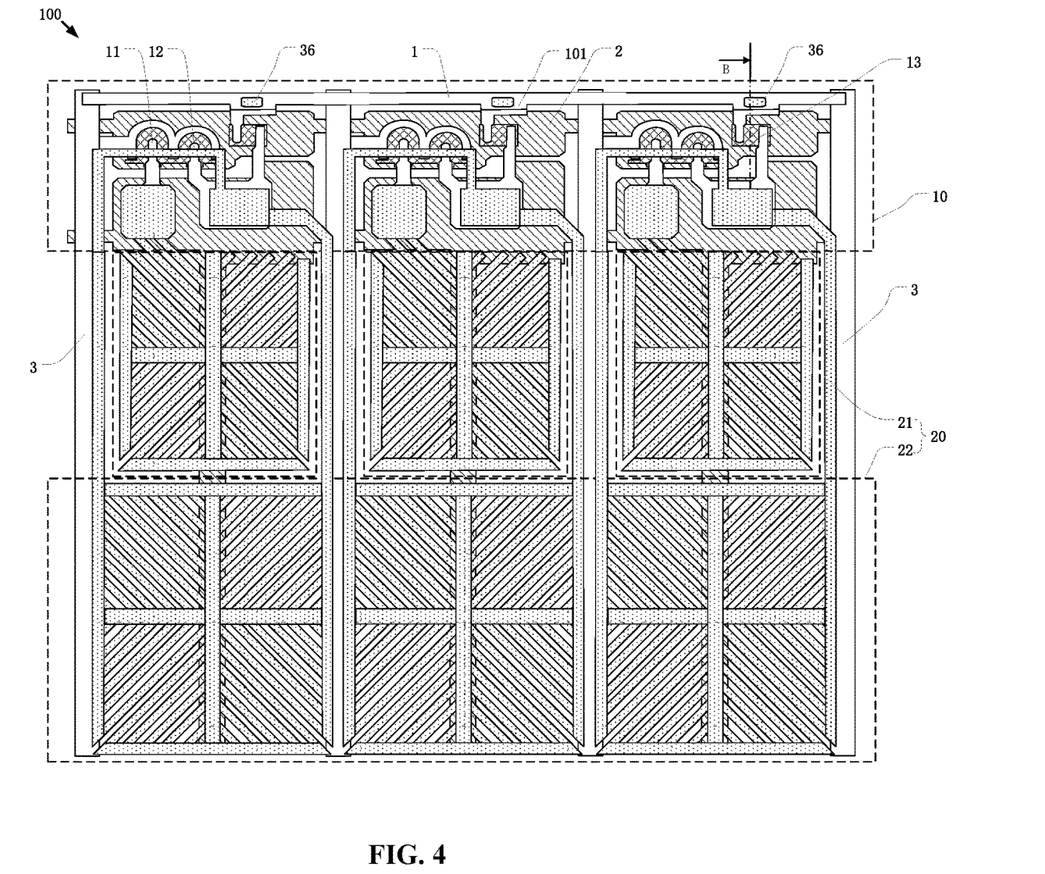
FIG. 4 is a schematic diagram of a planar structure of a row of pixel units of the array substrate in an embodiment of the present application.

As shown in FIG. 3 and FIG. 4, an array substrate 100 is provided in an embodiment of the present application, which is provided with a plurality of rows of pixel units 110; the plurality of rows of pixel units 110 are arranged in tandem to form an array structure.

As shown in FIG. 3, each of the pixel units 110 includes a transistor area 10 and a pixel area 20; and a main transistor unit 11, a sub-transistor unit 12, and a shared transistor unit 13 are provided in the transistor area 10. Each of the main transistor unit 11, the sub-transistor unit 12, and the shared transistor unit 13 includes a source and a drain; each row of the pixel units 110 includes a shared metal wiring 1; the shared metal wiring 1 is provided above the transistor area 10, extends along the arrangement direction of the pixel units 110 in the corresponding one of the rows, and is electrically connected to the source of the shared transistor unit 13 in each of the pixel units 110 in turn. The shared metal wiring 1 is exactly above positions of the sources of the shared transistor units 13, and meanwhile, the shared metal wiring 1 is electrically connected to the source of the shared transistor unit in each of the pixel units 110 in turn, so that the source wirings of the shared transistor units 13 can be saved, thereby increasing the aperture ratio and reducing the manufacturing cost.

Figure 5:
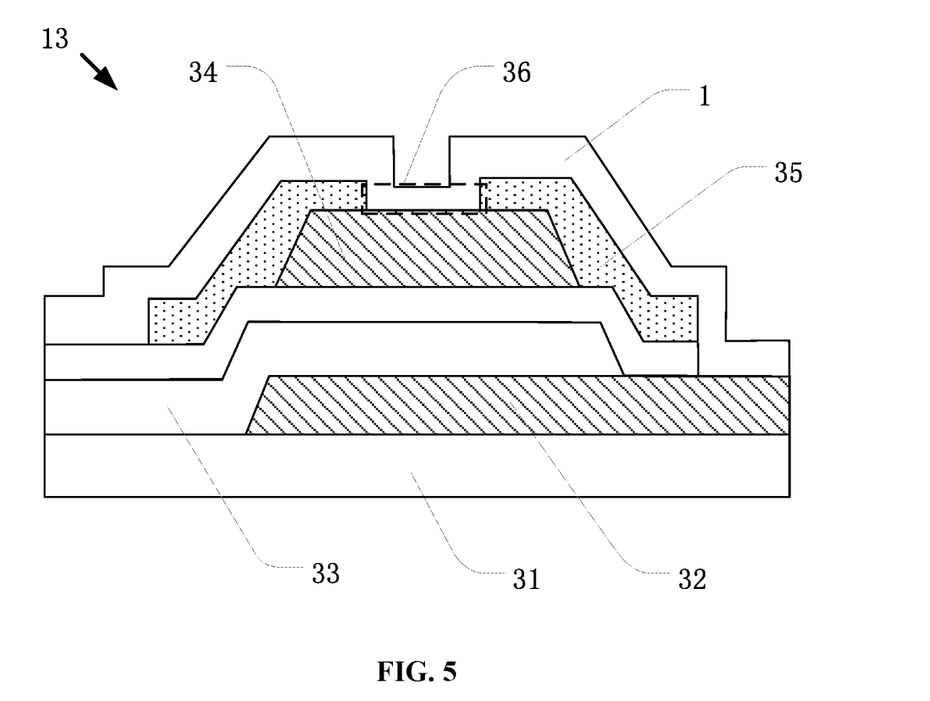
FIG. 5 is a cross-sectional view of the shared transistor unit taken along the line B-B in FIG. 3 or FIG. 4.

As shown in FIG. 5, in this embodiment, the shared transistor unit 13 includes a glass substrate 31, a first metal layer 32, a gate insulating layer 33, a second metal layer 34, a passivation layer 35, and the shared metal wiring 1, which are stacked; wherein the first metal layer 32 is disposed on the glass substrate 31; the gate insulating layer 33 is disposed on the glass substrate 31 and covers the first metal layer 32; the second metal layer 34 is disposed on the gate insulating layer 33; the passivation layer 35 is disposed on the gate insulating layer 33, covers the second metal layer 34, and includes a via hole 36 to expose an upper surface of the second metal layer 34; the shared metal wiring 1 is disposed on the passivation layer 35 and passes through the via hole 36 to electrically connect the second metal layer 34.

In this embodiment, the material of the shared metal wiring 1 includes indium tin oxide, which is a transparent material, so that the shared metal wiring 1 is a transparent wiring, which improves the light transmittance.

In this embodiment, the shared metal wiring 1 includes a widened portion 101 at a position corresponding to the via hole 36, and the widened portion 101 protrudes from an edge of the shared metal wiring 1 toward a side of the transistor area 10. The provision of the widened portion 101 can facilitate the reduction of the width of the shared metal wiring 1 so as to increase the light transmittance while ensuring that the shared metal wiring 1 passes through the via hole 36 and is electrically connect the second metal layer 34, thus avoiding the problem of disconnection.

In this embodiment, the pixel unit 110 includes a red sub-pixel, a green sub-pixel, and a blue sub-pixel, and the shared metal wiring 1 is electrically connected to the blue sub-pixel. Since the driving voltage of the blue sub-pixel is higher than the driving voltages of the red sub-pixel and the green sub-pixel, the signal voltage of the shared metal wiring 1 will be higher, which is beneficial to control leakage condition of the shared transistor unit 13, thereby avoiding the leakage of the shared transistor unit 13.

In this embodiment, the transistor area 10 includes a scan line 2, and the shared metal wiring 1 is arranged in parallel with the scan line 2. That is, the shared metal wiring 1 extends along the arrangement direction of a row of the pixel units 110. The first metal layer 32 can be used as the gate of the shared transistor unit 13 to connect the scan line 2.

In this embodiment, the shared metal wiring 1 made of transparent indium tin oxide is electrically connected to the source of the shared transistor unit 13 of each of the pixel units 110, so that the source of the shared transistor unit 13 does not need to penetrate through the pixel area 20, thereby increasing the aperture ratio of the pixel area 20 and increasing the transmittance of the display panel; and the shared metal wiring 1 connects the shared transistor units 13 to uniformly control the leakage of the shared transistor unit 13.

It has been verified that compared with the 8-domain pixel structure shown in FIG. 2 of the prior art, this embodiment can increase the aperture ratio of the pixel area 20 by 7%-10% compared with the 8-domain pixel structure shown in FIG. 2. Accordingly, the light transmittance of the display panel is increased by 7%-10%, thereby improving the image quality and enhancing the competitiveness of the product.

In this embodiment, the pixel area 20 is disposed on one side of the transistor area 10; the arrangement direction of the pixel area 20 and the transistor area 10 is perpendicular to the extending direction of the shared metal wiring 1. That is, the pixel area 20 and the transistor area 10 are arranged in a longitudinal direction and perpendicular to the scan line 2.

In this embodiment, the pixel area 20 includes a main pixel area 21 and a sub-pixel area 22; the main pixel area 21 is arranged adjacent to the transistor area 10 and is electrically connected to the source of the main transistor unit 11. The sub-pixel area 22 is disposed on the side of the main pixel area 21 away from the transistor area 10, and is electrically connected to the drains of the sub-transistor unit 12 and the shared transistor unit 13.

In more detail, the main pixel area 21 is disposed on one side of the transistor area 10, and a first pixel electrode 211 is provided in the main pixel area 21. The first pixel electrode 211 is electrically connected to the drain of the main transistor unit 11, and the sub-pixel area 22 is disposed on the side of the main pixel area 21 away from the transistor area 10. The sub-pixel area 22 is U-shaped to half-enclose around the main pixel area 21, wherein the U-shaped half-enclosed surrounding may also be referred to half-enclosed wrapping, three-side surrounding, wrapping along the transistor area 10, etc. A second pixel electrode 221 is provided in the sub-pixel area 22, and the second pixel electrode 221 and the first pixel electrode 211 are not electrically connected to each other, and the second pixel electrode 221 is electrically connected to the drains of the sub-transistor unit 12 and the shared transistor unit 13.

In this embodiment, each of the first pixel electrode 211 and the second pixel electrode 221 includes a trunk and a branch. The trunks located in the main pixel area 21 and the sub-pixel area 22 extend in a longitudinal direction on the same straight line, and preferably the straight line extending in the longitudinal direction where the trunks are located is the median line of the main pixel area 21 and the sub-pixel area 22.

In this embodiment, by placing the main pixel area 21 and the sub-pixel area 22 on the same side of the transistor area 10, the area occupied by the transistor area 10 is reduced. Meanwhile, the sub-pixel area 22 forms a semi-enclosed structure to surrounds the main pixel area 21, which can reduce the coupling capacitance formed in the main pixel area 21 and improve the color shift.

In this embodiment, the top view projection of the main pixel area 21 is an axially symmetrical pattern, and the axially symmetrical pattern may be symmetrical with respect to the transverse axis or symmetrical with respect to the longitudinal axis. The shape of the top view projection of the main pixel area 21 specifically includes, but is not particularly limited to, a symmetrical cone, a symmetrical triangle, a symmetrical semicircle, a symmetrical inverted trapezoid, a concave rectangle, an hourglass shape, or a rectangle. In this embodiment, it is preferably a rectangle, as shown in FIG. 3 and FIG. 4.

In this embodiment, the array substrate 100 further includes a data wiring 3, which is arranged between adjacent ones of the sub-pixel areas 22; the data wiring 3 is electrically connected to the sources of the first transistor unit and the second transistor unit.

In this embodiment, the area of the main pixel area 21 is smaller than the area of the sub pixel area 22. In this way, the sub-pixel area 22 can be arranged in a U-shaped to half-enclose around the main pixel area 21, and the distance between the main pixel area 21 and the data wiring 3 can be increased, thereby reducing the coupling capacitance therebetween, thus improving color shift.

In this embodiment, the data wiring 3 is provided under the second pixel electrodes 221 in adjacent ones of the sub-pixel areas 22, and a projection of the data wiring 3 overlaps a projection of the second pixel electrode 221, so that a capacitor can be formed between the data wiring 3 and the second pixel electrode 221, and the common electrode wiring between adjacent ones of the sub-pixel areas, and the source and the drain wirings surrounding the main pixel area and the sub-pixel area as shown in FIG. 2 in the prior art can be removed, which can shorten the distance between the borders of the second pixel electrodes of adjacent ones of the sub-pixel areas 22, thereby increasing the distribution width of the pixel electrodes in the main pixel area 21 and the sub-pixel area 22, thus increasing the aperture ratio.

In this embodiment, the projections of the data wiring 3 and the main pixel area 21 do not overlap each other, so that the formation of the coupling capacitance between the data wiring 3 and the main pixel area 21, thereby improving color shift.

Based on the same inventive concept, an embodiment of the present disclosure provides a display panel, and the display device includes the array substrate 100 provided by the any of the above embodiments.

The display panel in the embodiment of the present disclosure may be any product or component with a display function, such as a mobile phone, a tablet computer, a television, a monitor, a notebook computer, a digital photo frame, a navigator, and the like.

The working principle of the display panel provided in this embodiment is consistent with the working principle of the foregoing embodiment of the array substrate 100. Specific structural relationships and working principles can be referred to the foregoing embodiment of the array substrate 100, and will not be repeated herein for brevity.

The technical effect of the present application is to provide an array substrate and a display panel. On the one hand, a shared metal wiring made of indium tin oxide is electrically connected to the source of the shared transistor unit of each of the pixel units, such that the source of the shared transistor unit does not need to penetrate through the pixel area, thereby increasing the aperture ratio of the pixel area and increasing the transmittance of the display panel; and the shared metal wiring connects the shared transistor units, which can uniformly control the leakage of the shared transistor units. On the other hand, by arranging the main pixel area and the sub-pixel area on the same side of the transistor area, the area occupied by the transistor area is reduced; and meanwhile, the sub-pixel area forms a structure to half-enclose around the main pixel area, which can increase the distance between the main pixel area and the main data area to reduces the coupling capacitance therebetween and improve the color shift. On further the other hand, the common electrode wiring between adjacent ones of the sub-pixel areas, and the source and the drain wirings surrounding the main pixel area and the sub-pixel area are removed, which can shorten the distance between the borders of the second pixel electrodes of adjacent ones of the sub-pixel areas, thereby increasing the distribution width of the pixel electrodes in the main pixel area and the sub-pixel area, thus increasing the aperture ratio.

Those skilled in the art should understand that the scope of the invention involved in this application is not a technical solution formed by a specific combination of the above technical features, and should also cover the replacement of the above technical features without departing from the inventive concept. Other technical solutions formed by arbitrarily combining the same features. For example, the above-mentioned features are similar to those disclosed in this application (but not limited to). The above-mentioned are only the preferred embodiments of the present invention. It is appropriately pointed out that for those of ordinary skill in the art, they can substitute without departing from the principle of the present invention. Next, some improvements and modifications can also be made, and these improvements and modifications should also be regarded as the protection scope of the present invention.

The array substrate and the display panel provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. An array substrate, comprising a plurality of rows of pixel units, wherein
   each of the pixel units is provided with a transistor area; a main transistor unit, a sub-transistor unit, and a shared transistor unit are disposed in the transistor area; and the shared transistor unit comprises a source and a drain;
   each of the plurality of rows of the pixel units is provided with a shared metal wiring; and the shared metal wiring is provided above the transistor area and extends along an arrangement direction of the pixel units in a corresponding one of the plurality of rows, and is electrically connected to the source of the shared transistor unit in each of the pixel units, sequentially.

2. The array substrate according to claim 1, wherein the shared transistor unit comprises:
   a glass substrate;
   a first metal layer disposed on the glass substrate;
   a gate insulating layer disposed on the glass substrate and covering the first metal layer;
   a second metal layer disposed on the gate insulating layer; and
   a passivation layer disposed on the gate insulating layer and covering the second metal layer, and provided with a via hole to expose an upper surface of the second metal layer, wherein
   the shared metal wiring is disposed on the passivation layer and penetrates through the via hole to electrically connect the second metal layer.

3. The array substrate according to claim 1, wherein a material of the shared metal wiring comprises indium tin oxide.

4. The array substrate according to claim 1, wherein the shared metal wiring is provided with a widened portion at a position corresponding to the via hole.

5. The array substrate according to claim 4, wherein the widened portion protrudes from an edge of the shared metal wiring toward a side of the transistor area.

6. The array substrate according to claim 1, wherein each of the pixel units comprises a red sub-pixel, a green sub-pixel, and a blue sub-pixel.

7. The array substrate according to claim 6, wherein the shared metal wiring is electrically connected to the blue sub-pixel.

8. The array substrate according to claim 1, wherein a scan line is provided in the transistor area, and the shared metal wiring is arranged in parallel with the scan line.

9. The array substrate according to claim 1, wherein each of the pixel units further comprises:
a pixel area defined at one side of the transistor area, wherein an arrangement direction of the pixel area and the transistor area is perpendicular to an extending direction of the shared metal wiring.

10. The array substrate according to claim 9, wherein the pixel area comprises:
a main pixel area arranged adjacent to the transistor area and electrically connected to a source of the main transistor unit; and
a sub-pixel area arranged at a side of the main pixel area away from the transistor area and electrically connected to drains of the sub-transistor unit and the shared transistor unit.

11. The array substrate according to claim 10, wherein the sub-pixel area is U-shaped to half-enclose around the main pixel area.

12. The array substrate according to claim 10, wherein an area of the main pixel area is smaller than an area of the sub-pixel area.

13. The array substrate according to claim 10, wherein a top-view projection of the main pixel area is an axisymmetric pattern.

14. The array substrate according to claim 10, wherein a top-view projection of the sub-pixel area is an axisymmetric pattern.

15. A display panel, comprising an array substrate, and the array substrate provided with a plurality of rows of pixel units, wherein
each of the pixel units is provided with a transistor area; a main transistor unit, a sub-transistor unit, and a shared transistor unit are disposed in the transistor area; and the shared transistor unit comprises a source and a drain;
each of the plurality of rows of the pixel units is provided with a shared metal wiring; and the shared metal wiring is provided above the transistor area and extends along an arrangement direction of the pixel units in a corresponding one of the plurality of rows, and is electrically connected to the source of the shared transistor unit in each of the pixel units, sequentially.

16. The display panel according to claim 15, wherein the shared transistor unit comprises:
a glass substrate;
a first metal layer disposed on the glass substrate;
a gate insulating layer disposed on the glass substrate and covering the first metal layer;
a second metal layer disposed on the gate insulating layer; and
a passivation layer disposed on the gate insulating layer and covering the second metal layer, and provided with a via hole to expose an upper surface of the second metal layer, wherein
the shared metal wiring is disposed on the passivation layer and penetrates through the via hole to electrically connect the second metal layer.

17. The display panel according to claim 15, wherein a material of the shared metal wiring comprises indium tin oxide.

18. The display panel according to claim 15, wherein the shared metal wiring is provided with a widened portion at a position corresponding to the via hole, and the widened portion protrudes from an edge of the shared metal wiring toward a side of the transistor area.

19. The display panel according to claim 15, wherein each of the pixel units comprises a red sub-pixel, a green sub-pixel, and a blue sub-pixel, and the shared metal wiring is electrically connected to the blue sub-pixel.

20. The display panel according to claim 15, wherein a scan line is provided in the transistor area, and the shared metal wiring is arranged in parallel with the scan line.

* * * * *